(12) United States Patent
Yang

(10) Patent No.: US 6,291,881 B1
(45) Date of Patent: Sep. 18, 2001

(54) DUAL SILICON CHIP PACKAGE

(75) Inventor: Te-Sheng Yang, Taipei (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/262,967

(22) Filed: Mar. 4, 1999

(51) Int. Cl.[7] ................................................. H01L 23/495
(52) U.S. Cl. ............................................. 257/723; 257/777
(58) Field of Search .................................... 257/777, 783, 257/668, 737, 778, 784, 786, 723

(56) References Cited

U.S. PATENT DOCUMENTS

| | | | |
|---|---|---|---|
| 5,530,292 | * 6/1996 | Waki et al. | 257/724 |
| 5,545,922 | * 8/1996 | Golwalker et al. | 257/668 |
| 5,793,108 | * 8/1998 | Nakanishi et al. | 257/723 |
| 5,917,242 | * 6/1999 | Ball | 257/737 |
| 5,952,725 | * 9/1999 | Ball | 257/777 |
| 5,959,347 | * 9/1999 | Grigg et al. | 257/668 |
| 6,002,178 | * 12/1999 | Lin | 257/778 |

* cited by examiner

Primary Examiner—Mary Wilczewski
(74) Attorney, Agent, or Firm—Blakely Sokoloff Taylor & Zafman

(57) ABSTRACT

A dual silicon chip package structure is described, whose first silicon chip is supported by special lead frame pins. The lead frame pins extend into the peripheral region of the first silicon chip so that the front surface of the first silicon chip can be attached to those lead frame pins. Bonding pads on the front surface of the first silicon chip are located around the central region. The backside of a second silicon chip is attached to the backside of the first silicon chip. Bonding pads on both the first silicon chip and the second silicon chip are connected to the lead frame using conductive wires. In addition, if the second silicon chip is smaller than the first silicon chip, the second silicon chip can sit with its backside on top of the front surface of the first silicon chip as well. In that case, the backside of the first silicon chip has to sit above the lead frame pins, and the bonding pads on the front surface of the first silicon chip has to be located around the peripheral region.

3 Claims, 2 Drawing Sheets

DUAL SILICON CHIP PACKAGE

BACKGROUND OF THE INVENTION

1. Field of Invention

The present invention relates to a semiconductor package required for forming the package. More particularly, the present invention relates to a dual silicon chip package.

2. Description of Related Art

The manufacturing of an integrated circuit (IC) can be roughly divided into three separate stages: the manufacturing of a silicon chip, the production of an integrated circuit on silicon chip, and the packaging of the silicon chip. Hence, the packaging of the silicon chip can be regarded as the final stage in the integrated circuit fabrication process. Conventional IC package used to contain a single chip. However, in order to increase the capacity of, say, a memory package, or to integrate silicon chips having different functions, a number of packages now contain two silicon chips.

In general, for an IC package having two silicon chips, the silicon chips are respectively mounted on the upper side and the lower side of the lead frame. However, if the circuit layout of the two silicon chips is the same, for example, two pieces of identical DRAM chips are used to increase memory capacity, the metal wires that connect the bonding pads on the silicon chips with the lead frame may have to cross over each other, leading to certain degree of entanglement with each other. Therefore, various IC packaging methods are developed to prevent metal wires from crossing and entangling each other.

FIG. 1 is a schematic, cross-sectional side view of a conventional dual silicon chip package. As shown in FIG. 1, a first silicon chip 12 and a second silicon chip 16 are respectively mounted onto the upper and the lower surface of a die pad 14. The lower silicon chip 16 has a circuit layout that is the same as the mirror image of the upper silicon chip 12. Hence, locations of bonding pads on the lower silicon chip 16 are a mirror reflection of the locations of bonding pads on the upper silicon chip 12. This type of IC package ensures that no metallic wires 10 cross each other. However, due to the mirror reflection layout of silicon chip 16 with respect to the silicon chip 12, circuit design between the two must be different. Hence, an IC package that employs this type of packaging requires two functionally the same silicon chip having different circuit layout. Thus, besides increasing production cost, this type of design increases production time as well.

FIG. 2 is a schematic, cross-sectional side view of another conventional dual silicon chip package. As shown in FIG. 2, interposers 26 are added to the underside of the die pad 23. Through these interposers 26, bonding pad positions of the lower silicon chip 24 can be switched. Therefore, the bonding pad positions of the lower silicon chip 24 with respect to the surrounding leads corresponds to the bonding pad positions of the upper silicon chip 22. With this type of arrangement, no metallic wires 20 have to cross each other. However, if the lower silicon chip 24 is of a considerable size, the underside of the die pad 23 may not have sufficient area to accommodate the interposers 26. Furthermore, using interposers 26 increases the interface between the upper silicon chip 22 and the lower silicon chip 24. As interface increases, problems caused by stress and heat increases correspondingly. All these factors contribute to a lower reliability of the package and compromise the operation speed of the chip.

An alternative structure, very similar to the dual silicon chip package but using a printed circuit board (PCB) instead of a silicon die pad, is also quite common. Since a printed circuit board is employed, the upper silicon chip is able to match bonding pad positions with respect to the lower silicon chips. However, material for fabricating PCB is quite different from the die pad in a lead frame. Hence, adhesive strength with a silicon chip is inferior and cost of production is consequently higher. In addition, an electrical signal has to go through the PCB, which can lead to signal degradation problems.

All the aforementioned IC packages for housing two silicon chips rely on the die pad as a supporting structure. These type of structures, however, tend to require considerable interface areas. Moreover, stress resulting from the use of different materials also lowers the reliability of the device. Furthermore, since the silicon chips are attached to the die pad with metal wires connecting to the lead frame, the only way for heat to dissipate is through those wires. Insufficient heat dissipation can easily lead to an increase in resistance and a decrease in operating speed for the device inside the package.

In light of the foregoing, there is a need to improve the design of the dual silicon chip IC package.

SUMMARY OF THE INVENTION

Accordingly, the purpose of the present invention is to provide a package structure for accommodating two silicon chips.

To achieve these and other advantages and in accordance with the purpose of the invention, as embodied and broadly described herein, the invention provides a dual silicon chip package structure. The package includes a lead frame, a first silicon chip and a second silicon chip. The front face of the first silicon chip has a plurality of bonding pads distributed around its periphery. The back face of the first silicon chip is attached to the leads of the lead frame. The second silicon chip is smaller than the first silicon chip, and hence the backside of the second silicon chip can be attached to the front face of the first silicon chip. There is a plurality of conductive wires linking the bonding pads on the first silicon chip to the upper side of the lead frame. Similarly, there is a plurality of conductive wires linking the bonding pads on the second silicon chip and the upper side of the lead frame. Because the first and the second silicon chips form a stack, the conductive wires do not cross-entangle or cross-connect with each other.

The present invention also provides a second embodiment of the dual silicon chip package structure. The package includes a lead frame, a first silicon chip and a second silicon chip. The first silicon chip and the second silicon chip have roughly the same size. The front face of the first silicon chip has a plurality of first bonding pads distributed near its central region while the peripheral region are attached to the lead frame. Meanwhile, the backside of the second silicon chip is attached to the backside of the first silicon chip. A plurality of conductive wires is used for connecting the bonding pads on the first silicon chip to the lower side of the lead frame. Similarly, a plurality of conductive wires also connects the bonding pads on the second silicon chip to the upper side of the lead frame. Hence, conductive wires do not cross-entangle and cross-connect with each other.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
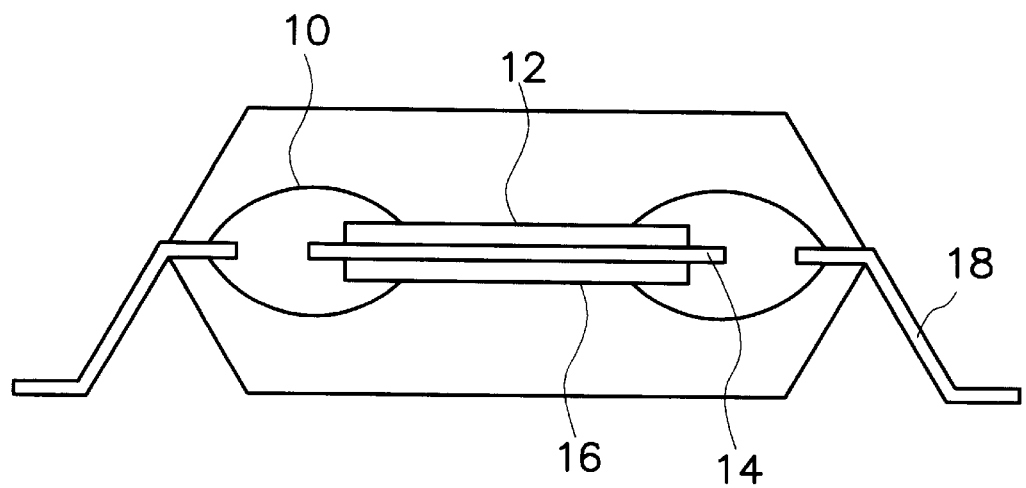
FIG. 1 is a schematic, cross-sectional side view of a conventional dual silicon chip package.
Figure 2:
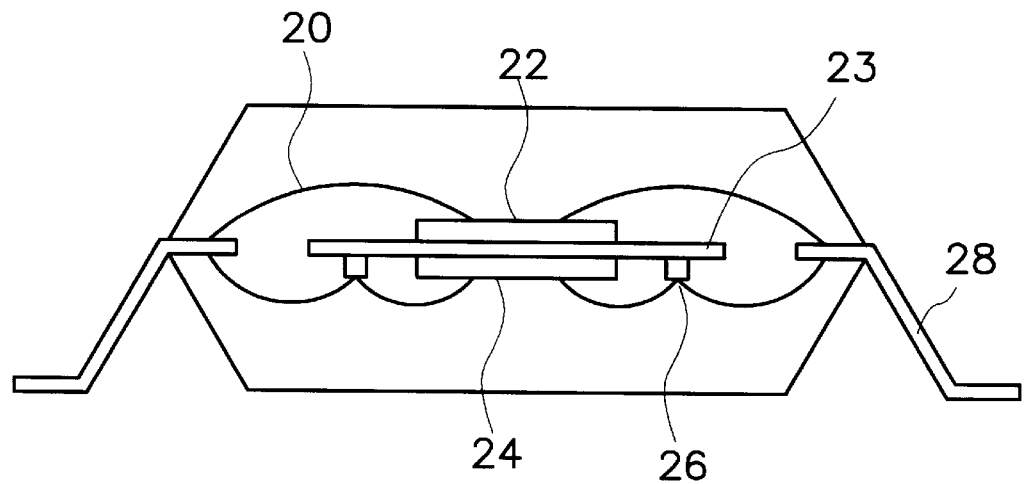
FIG. 2 is a schematic, cross-sectional side view of another conventional dual silicon chip package.

Reference will now be made in detail to the present preferred embodiments of the invention, examples of which are illustrated in the accompanying drawings. Wherever possible, the same reference numbers are used in the drawings and the description to refer to the same or like parts.

Figure 3:
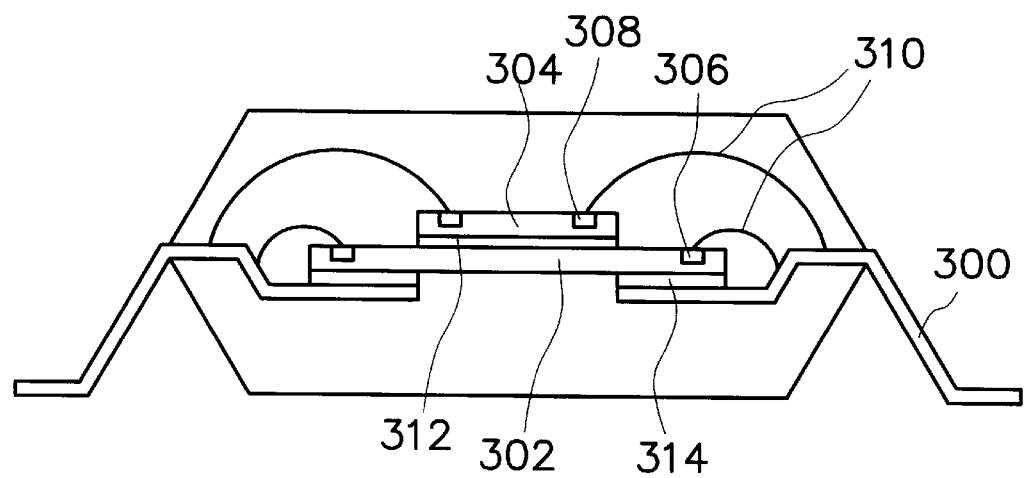
FIG. 3 is a schematic, cross-sectional side view of a dual silicon chip package according to a first embodiment of this invention.

FIG. 3 is a schematic, cross-sectional side view of a dual silicon chip package according to a first embodiment of this invention.

In the first embodiment, a chip-on-lead (COL) packaging process is employed. In other words, the lead frame pins 300 extend into the area below the first silicon chip 302. Therefore, the backside of the first silicon chip 302 is attached to the lead frame pins 300 via adhesive 314 instead of a die pad as in a conventional package design. On the other hand, the backside of the second silicon chip 304 is attached to the front surface of the first silicon chip 302. Consequently, the lead frame pins 300, the first silicon chip 302 and the second silicon chip 304 together form a stack. The front surface of the first silicon chip 302 has a plurality of bonding pads 306 that are connected to various conductive, lead frame pins 300 via metallic wires 310. Similarly, the front surface of the second silicon chip 304 also has a plurality of bonding pads 308 that are connected to various conductive, lead frame pins 300 via metallic wires 310.

The present invention also provides a method for forming the dual silicon chip package according to the first embodiment. This method is especially suitable for manufacturing a package whose second silicon chip 304 has an area smaller than the first silicon chip 302. The method includes the steps of first providing a lead frame whose pins 300 extends into the underside of the first silicon chip 302. Next, adhesive material 314, for example, adhesive tape, is used to attach the backside of the first silicon chip 302 onto the lead frame pins 300. Bonding pads 306 on the front surface of the first silicon chip 302 are distributed around the peripheral region.

Thereafter, joining material 312 such as adhesive tape or silver paste is used to attach the backside of the second silicon chip 304 onto the front surface of the first silicon chip 302. Since the bonding pads 306 of the first silicon chip 302 are limited to the peripheral region of the front surface, the second silicon chip 304 cannot possibly overshadow the bonding pad 306 locations of the first silicon chip 302. Finally, conductive wires 310 such as metal wires are used to connect bonding pads 306 on the first silicon chip 302 and bonding pads 308 on the second silicon chip 304 to the upper side of the lead frame pins 300. Ultimately, a dual silicon chip package structure as shown in FIG. 3 is formed.

Note that if the bonding pads of a previously designed, first silicon chip are located near the central region, the pads 306 can be relocated to the peripheral region similar to the first silicon chip 302 as shown in FIG. 3. This retrofitting can be achieved through a pad redistribution method involving a change to the photomask or an increase in the number of mask used.

Figure 4A:
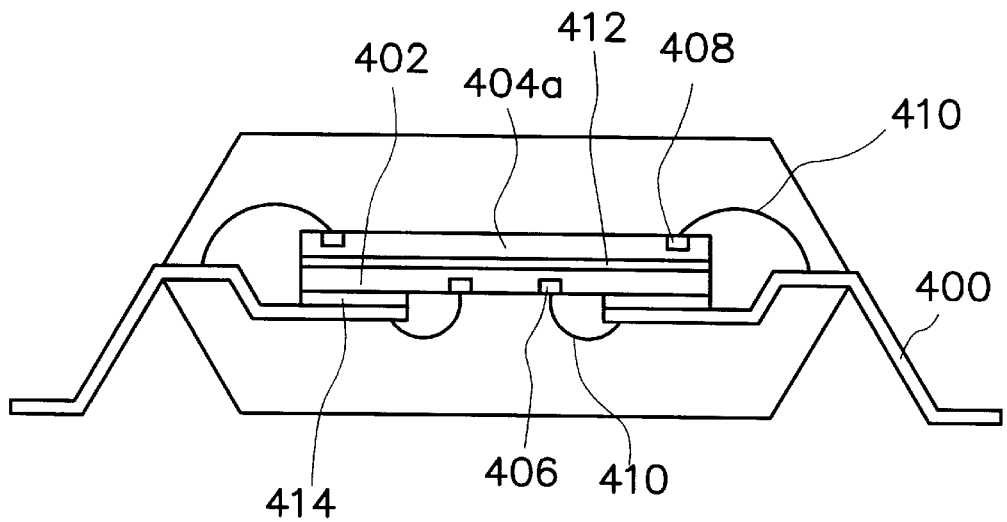
FIG. 4A is a schematic, cross-sectional side view of a dual silicon chip package according to a second embodiment of this invention.
Figure 4B:
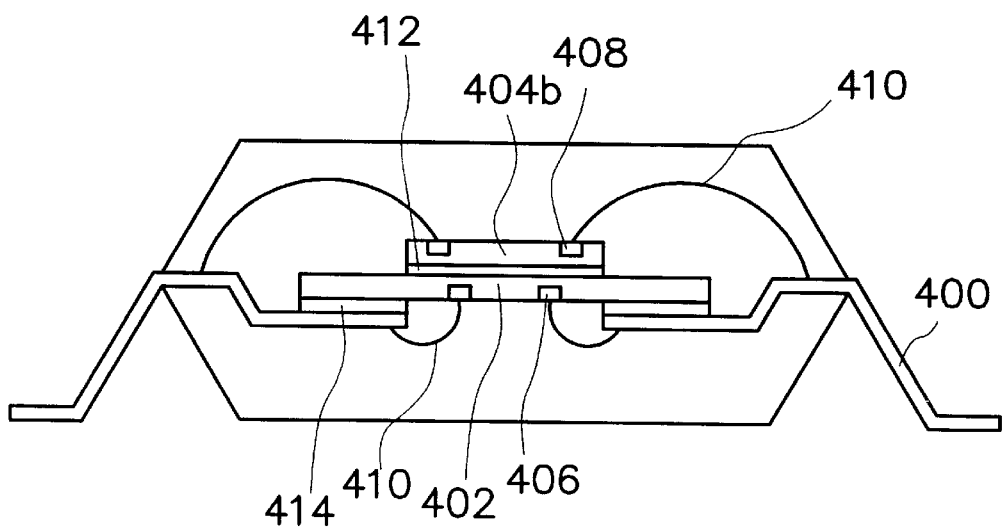
FIG. 4B is a schematic, cross-sectional side view showing a dual silicon chip package having a structure that differs slightly from the second embodiment of this invention as shown in FIG. 4A.

FIG. 4A is a schematic, cross-sectional side view of a dual silicon chip package according to a second embodiment of this invention. FIG. 4B is a schematic, cross-sectional side view showing a dual silicon chip package having a structure that differs slightly from the second embodiment of this invention as shown in FIG. 4A.

In fact, a main difference between the package structure in FIG. 4A and that in FIG. 4B is the sizes of the silicon chips. In FIG. 4A, both the first silicon chip 402 and the second silicon chip 404a in the package have the same dimensions. On the other hand, in FIG. 4B, the second silicon chip 404b is smaller than the first silicon chip 402. In the second embodiment of this invention, a lead-on-chip (LOC) packaging process is also employed. In other words, the lead frame pins 400 extend into the peripheral region of the first silicon chip 402. The front surface of the first silicon chip 402 is then attached to the lead frame pins 400, while the backside of the second silicon chip 404a or 404b is attached to the backside of the first silicon chip 402. The front surface of the first silicon chip 402 has a plurality of centrally distributed bonding pads 406. Through metal wires 410, bonding pads 406 are connected to various lead frame pins 400. The front surface of the second silicon chip 404a or 404b also has a plurality of bonding pads 408. They are similarly connected to the lead frame pins 400 through metal wires 410.

The present invention also provides a method for forming the dual silicon chip package according to the second embodiment. This method is suitable for manufacturing a package whose second silicon chip 404a and first silicon chip 402 is identical in size to or a package whose second silicon chip 404b is smaller than the first silicon chip 402. The method includes the steps of first providing a lead frame whose pins 400 extends into the peripheral region of the first silicon chip 402. Next, adhesive material 414, for example, adhesive tape, is used to attach the front surface of the first silicon chip 402 onto the lead frame pins 400. Bonding pads 406 are located near the central region on the front surface of the first silicon chip 402.

Thereafter, joining material 412 such as adhesive tape or silver paste is used to attach the backside of the second silicon chip 404a or 404b to the backside of the first silicon chip 402. Finally, conductive wires such as metal wires are used to connect bonding pads 406 on the first silicon chip 402 and bonding pads 408 on the second silicon chip 404a or 404b to the lead frame pins 400. Normally, if the second silicon chip 404a and the first silicon 402 have similar dimensions, adhesive tape rather than silver paste is used for attaching the two silicon chips just to prevent unexpected conduction.

Note that if the bonding pads of a previously designed, first silicon chip are distributed around the peripheral region, the pads 406 can be relocated to the central region similar to the first silicon chip 402 as shown in FIGS. 4A and 4B. This retrofitting can be achieved through a pad redistribution method involving a change to the photomask or an increase in the number of mask used. By relocating the bonding pads to the central region, no bonding pads are covered by the lead frame leads 400 and metal wires to the bonding pads 406 pass unhindered.

In summary, one major characteristic of this invention is the utilization of lead frame pins instead of a conventional die pad to support a silicon chip, and nothing but adhesive material is used to join the first silicon chip and the second silicon chip. Moreover, the interfaces of a conventional dual silicon chip package include first silicon chip/adhesive material, an adhesive material/die pad, a die pad/adhesive material as well as an adhesive material/second silicon chip. In contrast, the interfaces of the dual silicon chip package of this invention include a first silicon chip/adhesive material and an adhesive material/second silicon chip, only. Therefore, stress problems resulting from various interfacing materials are less and reliability of the package increases considerably.

Another characteristic of this invention is the direct attachment of one of the silicon chips to the lead frame leads. Therefore, instead of relying on conductive wires for heat dissipation, each lead frame lead serves as a heat sink for conducting heat away from the silicon chip. Hence, slowdown of IC package due to over-accumulation of heat can be avoided.

A third characteristic of this invention is that one silicon chip can stack on top of the other or they can be attached to each other, back-to-back. In addition, bonding pads are limited to neither the central region nor the peripheral region of a silicon chip. A redistribution method may be used to relocate the bonding pads to fit whatever configuration is demanded by the dual silicon chip package structure.

A fourth characteristic of this invention is that silicon chips of the same size or of different sizes can both be accommodated inside the dual silicon chip package.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A dual silicon chip package structure, comprising:

a first silicon chip defining a front surface, a backside, and a peripheral region, the first silicon chip having a plurality of bonding pads distributed around the peripheral region on the front surface;

a plurality of extended lead frame pins, each lead frame pin defining a first surface and a second surface, wherein each lead frame pin first surface is attached to the backside of the first silicon chip by an insulated adhesive material;

a second silicon chip defining a front surface and a backside and having a plurality of bonding pads on the second silicon chip front surface, wherein the second silicon chip is smaller than the first silicon chip and the backside of the second silicon chip is attached to the front surface of the first silicon chip;

a plurality of first conductive wires linking the bonding pads on the first silicon chip to the first surface of the lead frame pins; and a plurality of second conductive wires linking the bonding pads on the second silicon chip to the first surface of the lead frame pins.

2. The structure of claim 1, wherein the backside of the second silicon chip is attached to the front surface of the first silicon chip by adhesive material.

3. The structure of claim 1, wherein the bonding pads on the front surface of the second silicon chip are distributed around a peripheral region of the second silicon chip and wherein each lead frame pin first surface is attached to the backside of the first silicon chip by an insulated adhesive material such that the plurality of bonding pads are exposed.

* * * * *